(12) United States Patent
Shields et al.

(10) Patent No.: US 8,895,953 B1
(45) Date of Patent: Nov. 25, 2014

(54) PROGRAMMABLE MEMORY ELEMENTS, DEVICES AND METHODS HAVING PHYSICALLY LOCALIZED STRUCTURE

(75) Inventors: Jeffrey Allan Shields, Sunnyvale, CA (US); John Ross Jameson, Burlingame, CA (US); Wei Ti Lee, San Jose, CA (US)

(73) Assignee: Adesto Technologies Corporation, Sunnyvale, CA (US)

( * ) Notice: Subject to any disclaimer, the term of this patent is extended or adjusted under 35 U.S.C. 154(b) by 0 days.

(21) Appl. No.: 13/545,958

(22) Filed: Jul. 10, 2012

Related U.S. Application Data

(60) Provisional application No. 61/508,334, filed on Jul. 15, 2011.

(51) Int. Cl.
*H01L 47/00* (2006.01)

(52) U.S. Cl.
USPC ............ 257/4; 257/2; 257/9; 257/E45.001; 438/102; 438/103; 438/104; 438/48

(58) Field of Classification Search
CPC ...................................... H01L 45/06
USPC ............ 257/2–5, 9, 296, 774, E45.001, 257/E45.002; 438/102–104, 48, 95
See application file for complete search history.

(56) References Cited

U.S. PATENT DOCUMENTS

| | | | |
|---|---|---|---|
| 5,761,115 A | 6/1998 | Kozicki et al. | |
| 6,635,914 B2 | 10/2003 | Kozicki et al. | |
| 6,927,411 B2 | 8/2005 | Kozicki | |
| 7,101,728 B2 | 9/2006 | Kozicki et al. | |
| 8,115,586 B2 | 2/2012 | Hosoi et al. | |
| 8,426,839 B1 | 4/2013 | Ma et al. | |
| 2010/0188879 A1 | 7/2010 | Sasaki | |
| 2010/0252798 A1 | 10/2010 | Sumino | |
| 2010/0264394 A1* | 10/2010 | Aozasa | 257/2 |

* cited by examiner

*Primary Examiner* — Mark A Laurenzi

(57) ABSTRACT

A programmable memory element can include an insulating layer formed over a bottom structure; an opening formed in the insulating layer; a sidewall structure formed next to side surfaces of the opening; a tapered structure formed within the opening adjacent to the sidewall structure; and a solid electrolyte forming at least a portion of a structure selected from: the bottom structure, the sidewall structure, and the tapered structure.

4 Claims, 21 Drawing Sheets

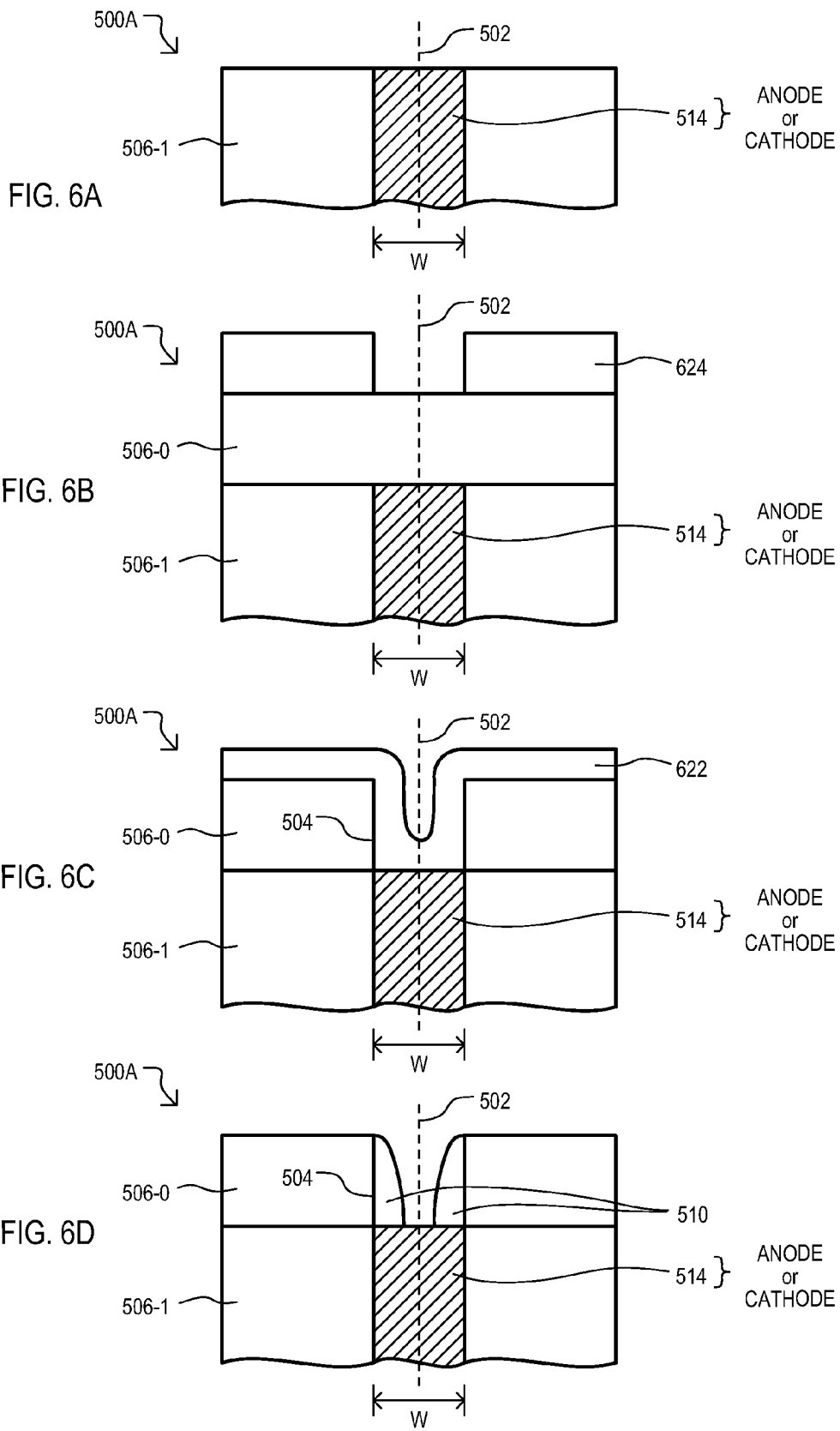

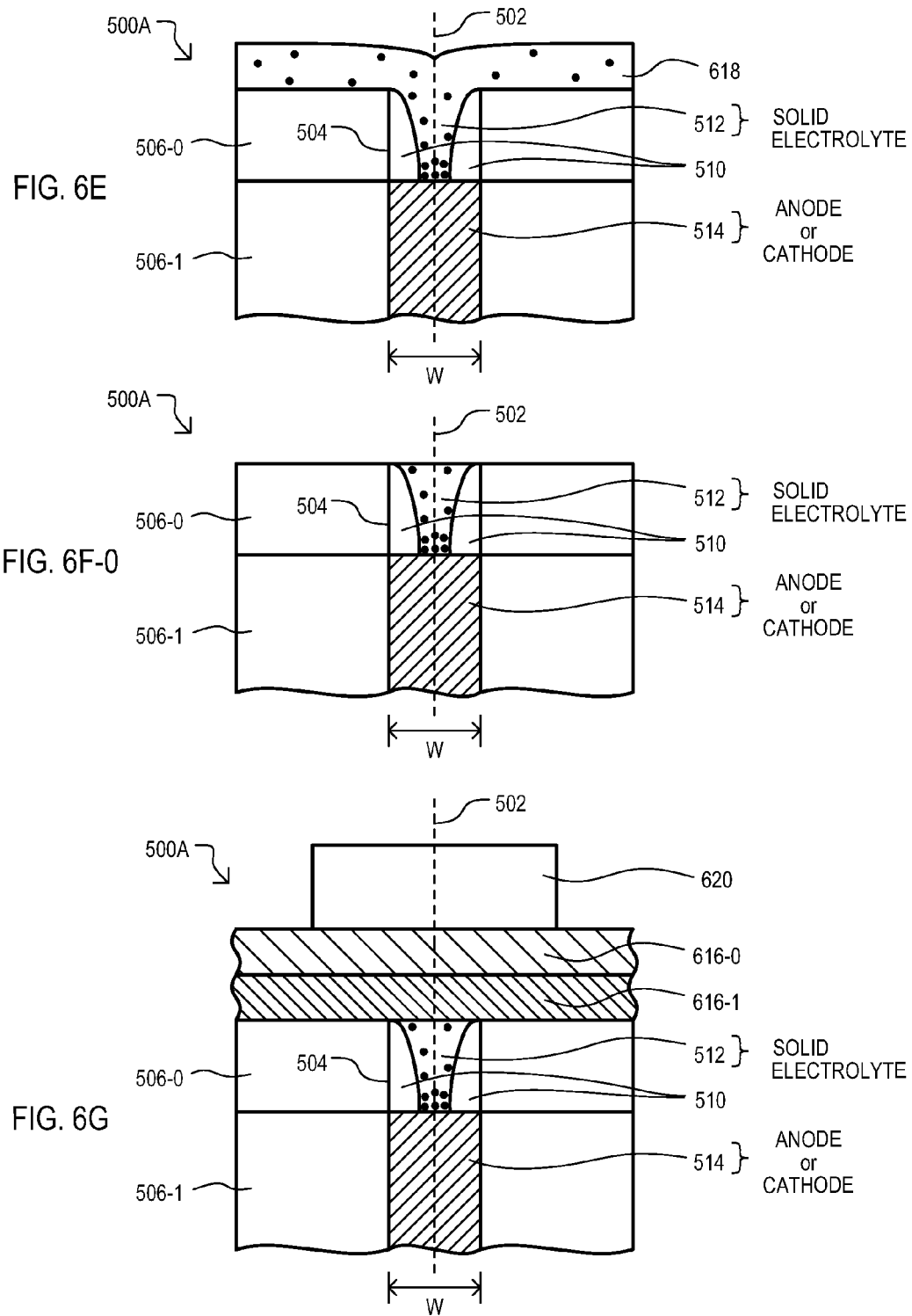

(BACKGROUND)

PROGRAMMABLE MEMORY ELEMENTS, DEVICES AND METHODS HAVING PHYSICALLY LOCALIZED STRUCTURE

This application claims the benefit of U.S. Provisional Patent Application Ser. No. 61/508,334 filed on Jul. 15, 2011, the contents of which are incorporated by reference herein.

TECHNICAL FIELD

The present disclosure relates generally to memory elements for storing data, and more particularly to back-end-of-line memory elements in integrated circuit devices.

BACKGROUND

Memory devices (e.g., integrated circuits) can include memory elements formed above a device substrate. Such memory elements can be considered "back end of line" (BEOL) elements as they can be formed after active devices (e.g., transistors) have been formed on, or in conjunction with, a substrate. Formation of devices such as transistors is often considered "the front end of line".

Various types of memory elements can be BEOL elements, including but not limited to: conductive bridging random access memory (CBRAM, also referred to as programmable metallization (PMC)) elements, phase change memory elements, ferroelectric memory elements, and magnetoresistive memory elements.

Conventionally, structures within BEOL type memory element structures can be limited by minimum feature sizes achievable by BEOL processes.

FIG. 16 shows a conventional CBRAM type memory element 1600. Conventional element 1600 includes an ion conducting material 1603 formed between an anode electrode 1601 and a cathode electrode 1605. An ion conducting material 1603 includes an ion conducting matrix with an oxidizable metal formed therein. In response to the application of a voltage that is positive at the anode electrode 1601 with respect to the cathode electrode 1605, a conductive path can be formed between the electrodes, reducing a resistance of the element 1600. In response to the application of a voltage that is negative at the anode electrode 1601 with respect to the cathode electrode 1605, such a conductive path can dissolve, returning the element 1600 to a higher resistance state.

In element 1600, anode and cathode electrodes (1601/1603), as well as ion conducting material 1603 can be localized to an opening 1607. Such an opening 1607 can have a minimum width of "F", where F is a minimum lithographic feature size.

BRIEF DESCRIPTION OF THE DRAWINGS

FIGS. 6A to 6F-1 and 6G are a series of side cross sectional views showing a method of fabricating memory elements like those shown in FIGS. 4A to 5B.

FIGS. 12A to 12F-1 are a series of side cross sectional views showing methods of fabricating CBRAM type elements like those shown in FIGS. 11A to 11C.

DETAILED DESCRIPTION

Figure 16:
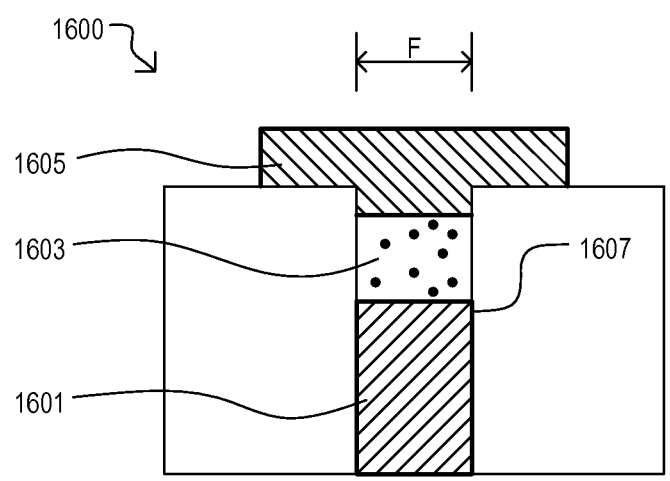
FIG. 16 is a side cross sectional view of a conventional conductive bridging random access memory (CBRAM) type memory element.

Below embodiments show structures, devices and methods for a programmable memory element having one or more features with improved localization, as compared to conventional approaches like that of FIG. 16. In the embodiments shown, like sections are referred to by the same reference character but with the first digit(s) corresponding to the figure number.

Figure 1:
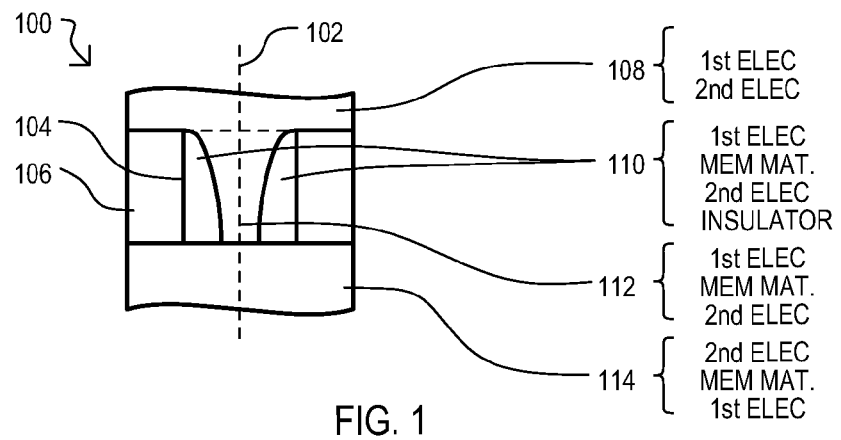
FIG. 1 is a side cross sectional view of a memory element according to an embodiment.

FIG. 1 shows a memory element 100 according to an embodiment. An element 100 can include one or more sections that are localized along an axis 102. An element 100 can include an opening 104 formed in an insulating layer 106, a top structure 108, a sidewall structure 110, a tapered structure 112 and a bottom structure 114. A tapered structure 112 can have a decreasing cross section along one direction (vertically down in FIG. 1). In the embodiment shown, sidewall structure 110 can have a cross section that varies in an opposite fashion to that of the tapered structure 112 (i.e., sidewall structure 110 widens, while tapered structure 112 narrows as one moves along the axis 102).

A memory element 100 can take various forms. In very particular embodiments, a memory element 100 can include a memory material (MEM MAT.), a first electrode ($1^{st}$ ELEC) and a second electrode ($2^{nd}$ ELEC) that are vertically aligned with one another. A memory material (MEM MAT.) can be programmed into two or more states, to thereby store data. As but a few examples, a memory material can be programmed to provide different impedance values (e.g., resistance, capacitance) and/or a dynamic change in impedance (e.g., different changes in resistance and/or capacitance under same bias conditions).

In particular embodiments, an element 100 can be a CBRAM type element, and a memory material (MEM MAT.) can be a solid electrolyte formed from one or more layers in which conductive regions (e.g., filaments) can be formed, to thereby alter an electrical property of such a material. One electrode (1$^{st}$ ELEC or 2$^{nd}$ ELEC) can be an anode electrode, while the other electrode (2$^{nd}$ ELEC or 1$^{st}$ ELEC) can be a cathode electrode. An anode electrode can include one or more elements that can be electrochemically activated to ion conduct through all or a portion of a memory material (MEM. MAT). A cathode electrode can substantially not include elements that can ion conduct through memory material (MEM. MAT).

Referring still to FIG. 1, an element 100 can take a different form depending upon which part of the element is given improved localization. Thus, as shown in FIG. 1, a top structure 108 can form all or part of a 1$^{st}$ ELEC or 2$^{nd}$ ELEC, sidewall structure 110 can form all or part of a 1$^{st}$ ELEC, 2$^{nd}$ ELEC, MEM MAT., or can be an insulator, a tapered structure 112 can form all or part of a 1$^{st}$ ELEC, 2$^{nd}$ ELEC, or MEM MAT., and a bottom structure 114 can form all of part of a 1$^{st}$ ELEC, 2$^{nd}$ ELEC, MEM MAT.

In a very particular embodiment, a top structure and tapered structure (108 and 112) can form all or part of one electrode (1$^{st}$ ELEC or 2$^{nd}$ ELEC,), and a bottom structure 114 can include a memory material (MEM MAT.). In such an arrangement, a sidewall structure 110 can also form part of the electrode, or can be formed from an insulating material.

In another particular embodiment, a top structure 108 can form all or part of one electrode (1$^{st}$ ELEC or 2$^{nd}$ ELEC), a sidewall structure 110 can include an insulating film, a tapered structure 112 can include a memory material (MEM MAT.), and a bottom structure 114 can form all or part of the other electrode (2$^{nd}$ ELEC or 1$^{st}$ ELEC).

In still another embodiment, a top structure 108 can form all or part of one electrode (1$^{st}$ ELEC or 2$^{nd}$ ELEC), a sidewall structure 110 can include a memory material (MEM MAT.), and a bottom structure 114 can form all or part of the other electrode (2$^{nd}$ ELEC or 1$^{st}$ ELEC). A tapered structure 112 can include a portion in contact with top structure 108 that forms another part of the one electrode, and can further include a portion in contact with bottom structure 114 formed from the memory material (MEM MAT.).

A tapered structure 112 can provide for localization of an element section along axis 102. In particular embodiments, a narrow portion of tapered structure 112 can have a cross sectional width that is less than a lithographic limit.

In this way, a memory element can include a tapered structure formed within an opening, adjacent to a sidewall structure formed on sides of the same opening, where such a tapered structure improves the localization of an electrode of a programmable memory element, a memory material of such element, or both.

Figure 2:
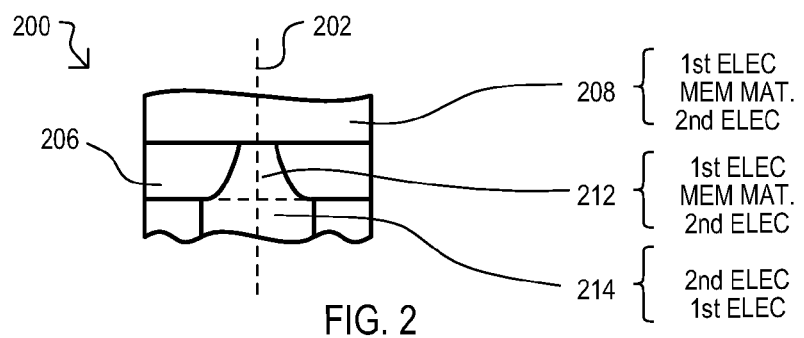
FIG. 2 is a side cross sectional view of a memory element according to another embodiment.

FIG. 2 shows a memory element 200 according to another embodiment. An element 200 can include sections like those of FIG. 1 that are localized along an axis 202. However, unlike FIG. 1, a tapered structure 212 can have a decreasing cross section in the opposite direction (vertically up in FIG. 2). Further, memory element 202 may not include a sidewall structure.

As in the case of FIG. 1, a memory element 200 can include a memory material (MEM MAT.), a first electrode (1$^{st}$ ELEC) and a second electrode (2$^{nd}$ ELEC) that are vertically aligned with one another. Further, an element 200 can take a different form depending upon which part of the element is given improved localization. In particular embodiments, an element 200 can be a CBRAM type element.

As shown in FIG. 2, a top structure 208 can form all or part of a 1$^{st}$ ELEC, MEM MAT., or 2$^{nd}$ ELEC, a tapered structure 212 can form all or part of a 1$^{st}$ ELEC, 2$^{nd}$ ELEC, or MEM MAT., and a bottom structure 214 can form all of part of a 1$^{st}$ ELEC or 2nd ELEC.

In a particular embodiment, a top structure 208 can form all or part of one electrode (1$^{st}$ ELEC or 2$^{nd}$ ELEC), a tapered structure 212 can include a memory material (MEM MAT.), and a bottom structure 214 can form all or part of the other electrode (2$^{nd}$ ELEC or 1$^{st}$ ELEC).

In another particular embodiment, a top structure 208 can include a memory material (MEM MAT.), while a bottom electrode and tapered structure (212 and 214) can form all or part of one electrode (1$^{st}$ ELEC or 2$^{nd}$ ELEC,).

In still another embodiment, a top structure 208 can form all or part of one electrode (1$^{st}$ ELEC or 2$^{nd}$ ELEC). A tapered structure 212 can include a portion in contact with top structure 208 that forms another part of the one electrode. A tapered structure 212 can further include a portion in contact with bottom structure 214 formed from the memory material (MEM MAT.).

In still another embodiment, a top structure 208 can include a memory material, and a tapered structure 212 and bottom structure 214 can form all or part of an electrode (1$^{st}$ ELEC or 2$^{nd}$ ELEC).

In this way, a memory element can include a tapered structure that narrows as it extends upward, where such a tapered structure improves the localization of an electrode of a programmable memory element, a memory material of such element, or both.

Figure 3:
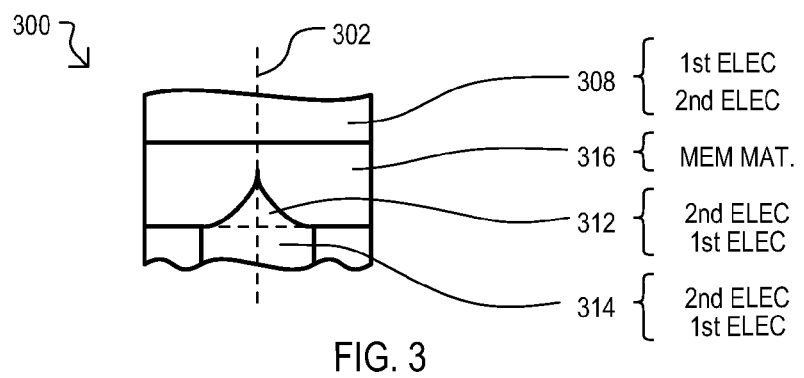
FIG. 3 is a side cross sectional view of a memory element according to a further embodiment.

FIG. 3 shows a memory element 300 according to another embodiment. An element 300 can include sections like those of FIG. 2, however a tapered structure 312 can have a narrow end that terminates within a memory layer 316. While FIG. 3 shows a tapered structure 312 with a pointed end, alternate embodiments can have a more blunt shaped end, or a flattened end.

As in the case of FIGS. 1 and 2, a memory element 300 can include a memory material (MEM MAT.), a first electrode (1$^{st}$ ELEC) and a second electrode (2$^{nd}$ ELEC) that are vertically aligned with one another. In particular embodiments, an element 300 can be a CBRAM type element.

As shown in FIG. 3, a top structure 308 can form all or part of a 1st ELEC or 2$^{nd}$ ELEC, a tapered structure 312 can form all or part of a 2nd ELEC or 1st ELEC, and a bottom structure 314 can form all of part of the same 2nd ELEC or 1$^{st}$ ELEC (i.e., 312 and 314 are parts of the same electrode). Tapered structure 312 can extend into memory material 316.

In this way, a memory element can include a tapered electrode with a narrow end that terminates within a memory material, where such a tapered structure improves the localization of an electrode of a programmable memory element.

Figure 4A:
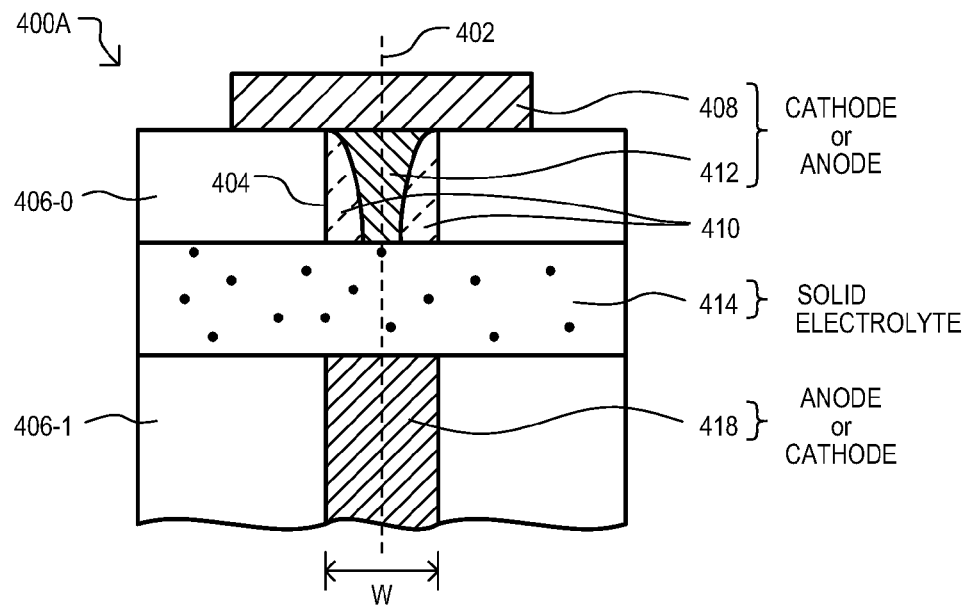
FIGS. 4A and 4B are side cross sectional views of memory elements having electrodes with tapered structures according to embodiments.
Figure 4B:
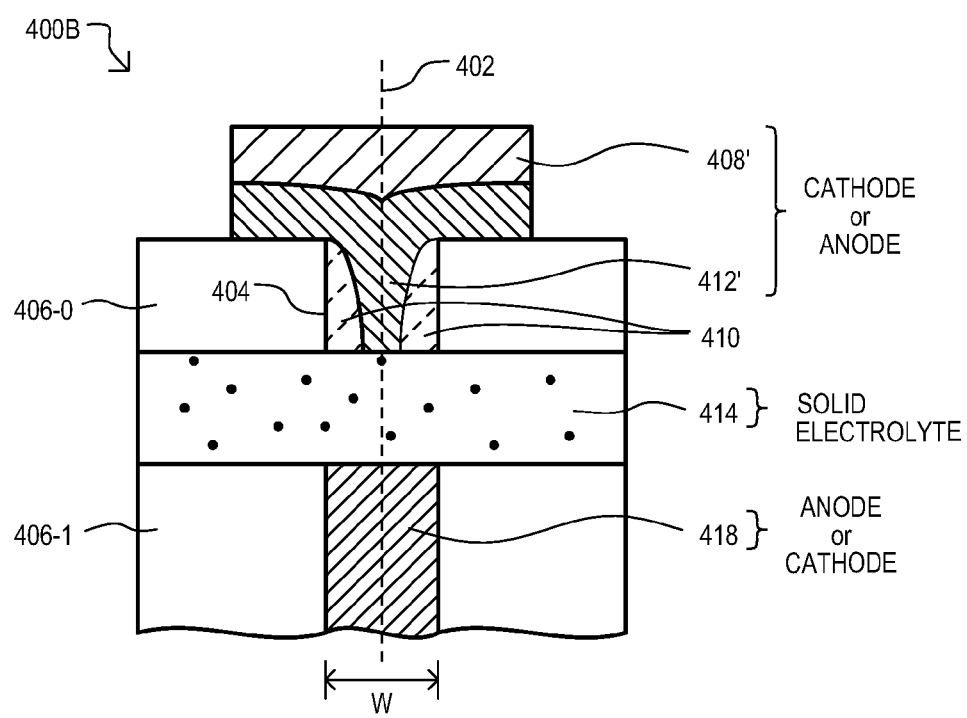

FIGS. 4A and 4B show CBRAM type memory elements 400A and 400B, according to embodiments, in side cross sectional views. FIGS. 4A and 4B show embodiments in which a top electrode can be localized.

Elements 400A/B can include sections like those of FIG. 1, and can be particular implementations of that shown in FIG. 1. Such a CBRAM type memory element can form a conductive filament within a solid electrolyte to thereby vary an impedance or impedance response. It is understood that the term "filament" should not be construed as taking a particular contiguous form. A filament, as used herein, can refer to one or more regions within a solid electrolyte that increase in conductivity due to ion conduction within the electrolyte.

In FIG. 4A, a top structure 408 and tapered structure 412 can together form an upper electrode. Such an upper electrode can be an anode or a cathode. If an upper electrode (408/412) forms an anode, at least a tapered structure 412 can include an element that can ion conduct in a solid electrolyte of the element 400. A top structure 408 can be formed from a different material than tapered structure 412. As but one example, a top structure 408 can be formed from a material suitable for enabling interconnection between multiple elements and/or or to other portions of an integrated circuit. Tapered structure 412 can be situated within an opening 404 adjacent to a sidewall structure 410. The tapered structure 412 can serve to narrowly localize the electrode.

A tapered structure 412 can be formed from a uniform material, or alternatively, can be formed from different materials. In one particular embodiment, a tapered structure 412 can have a different material in contact with bottom structure 414 (i.e., solid electrolyte), than that in contact with top structure 408.

As shown in FIG. 4A, a narrow portion of tapered structure 412 can have a cross section width, in a horizontal direction, that is less than a width of opening 404 (shown as W). In a particular embodiment, W can be a minimum lithographic feature size.

In one embodiment, a sidewall structure 410 can be formed all, or in part, by one or more insulating materials. In an alternate embodiment, a sidewall structure 410 can be formed all, or in part, by a conductive or semiconductive material. In such a case, a material of sidewall structure 410 can be selected to have a work function different from that of tapered structure 412. A difference in such work functions can be selected to confine the formation of a filament when an electric field is applied between the anode and cathode.

A bottom structure 414 can include a solid electrolyte. In response to an electric field applied to element 400A, a filament can be formed within the solid electrolyte. Further, due to the localization of the upper electrode (408/412), a resulting filament can be similarly localized.

Referring still to FIG. 4A, a lower electrode 418 can be formed below bottom structure 414 within a lower insulating layer 406-1. If an upper electrode (408/412) is an anode, a lower electrode 418 can be a cathode electrode. Conversely, if an upper electrode (408/412) is a cathode electrode, a lower electrode 418 can be an anode electrode. A lower electrode 418 can be formed from a conductive and/or semiconductive material.

Referring to FIG. 4B, a CBRAM type memory element 400B is shown that can include portions like those shown in FIG. 4A, and like features are referred to by the same reference character. Such portions can be subject to the same variations as FIG. 4A.

FIG. 4B differs from FIG. 4A in that a material of a tapered structure 412' can extend over a surface of an upper insulating layer 406-0. Further, a top structure 408 can be formed above upper insulating layer 406-0 on a top surface of tapered structure 412'.

In this way, a CBRAM type memory element can include a localized top electrode having a portion formed within an opening having sidewall structures.

Figure 5A:
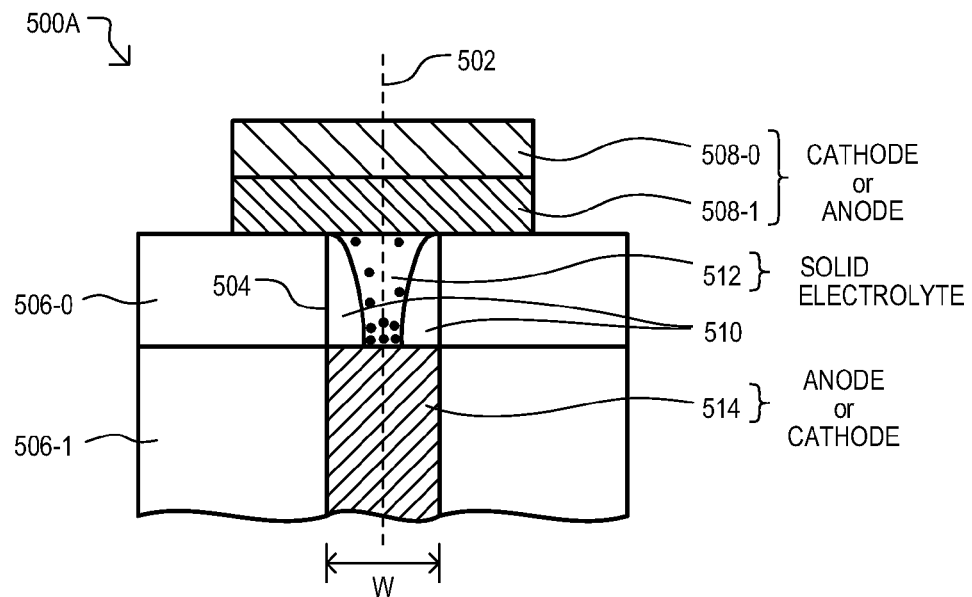
FIGS. 5A and 5B are side cross sectional views of memory elements having a solid electrolyte with a tapered structure according to embodiments.
Figure 5B:
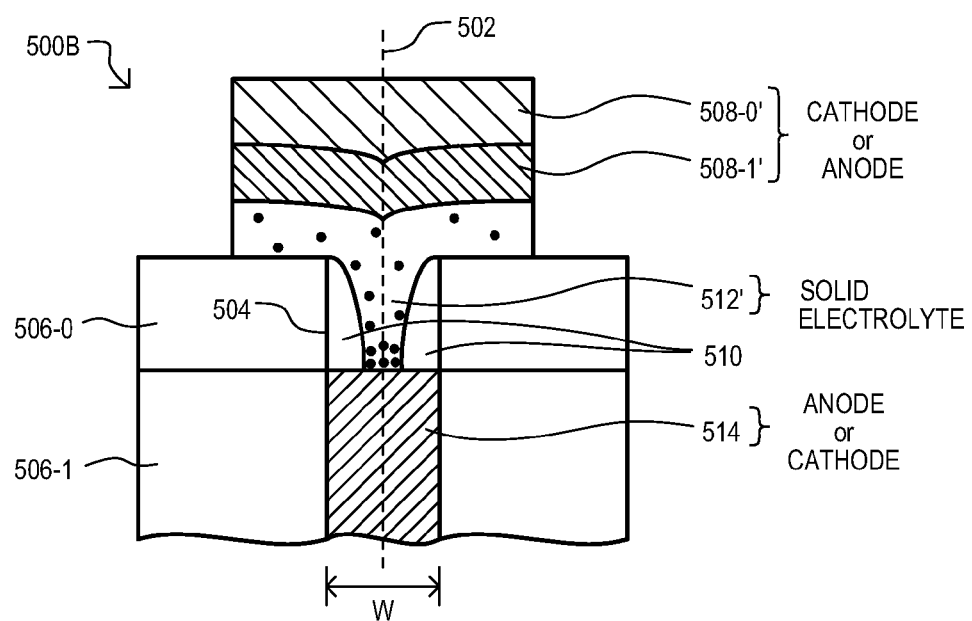

FIGS. 5A and 5B show CBRAM type memory elements 500A and 500B, according to further embodiments, in side cross sectional views. FIGS. 5A and 5B show embodiments in which a solid electrolyte can be localized.

Elements 500A/B can include sections like those of FIG. 1, and can be particular implementations of that shown in FIG. 1. Such a CBRAM type memory element can form a conductive filament as described herein.

In FIG. 5A, a top structure can include two layers 508-0/1 that together form an upper electrode. Such an upper electrode can be an anode electrode or a cathode electrode as described in FIGS. 4A and 4B.

Unlike FIGS. 4A and 4B, a tapered structure 512 can include a solid electrolyte. The tapered structure 512 can serve to narrowly localize the solid electrolyte. Such a solid electrolyte can be formed by one layer, or by multiple layers. In one particular embodiment, tapered structure 512 can be a solid electrolyte with one or more elements formed therein that can ion conduct within the solid electrolyte.

In one embodiment, a concentration of such ion conducting element(s) can be higher in the narrow end of the tapered structure 512. Such an arrangement can increase data retention and/or reduce leakage (in a high resistance state) for element 500A, as ion drift can be less likely in a direction away from the high concentration region. A narrow portion of tapered structure 512 can have a cross section width less than a width of opening 504 (shown as W). In a particular embodiment, W can be a minimum lithographic feature size.

In response to an electric field applied to element 500A, a filament can be formed within the solid electrolyte.

A sidewall structure 510 can be formed from one or more insulating materials. A bottom structure 514 can include a lower electrode. If an upper electrode (508-0/1) is an anode, a lower electrode 514 can be a cathode electrode. Conversely, if an upper electrode (508-0/1) is a cathode electrode, a lower electrode 514 can be an anode electrode. A lower electrode 514 can be formed from a conductive and/or semiconductive material.

Referring to FIG. 5B, a CBRAM type memory element 500B is shown that can include portions like those shown in FIG. 5A, and like portions are referred to by the same reference character and can be subject to the same variations as FIG. 5A.

FIG. 5B differs from FIG. 5A in that a tapered structure 512' material can extend over a surface of an upper insulating layer 506-0. Further, a top structure 508-0/1 can be formed above upper insulating layer 506-0 on a top surface of tapered structure 512'.

In this way, a CBRAM type memory element can include a localized solid electrolyte having a portion formed within an opening having sidewall structures on its sides.

FIGS. 6A to 6F-1 are a series of side cross sectional views showing a method of fabricating CBRAM type elements like those shown in FIGS. 5A and 5B (or alternatively 4A or 4B).

FIG. 6A shows the fabrication of a bottom electrode 514 in a lower insulating layer 506-1. A bottom electrode 514 can be formed from a single material, layered materials, or a compound of materials, including conductive and/or semiconductor materials. Similarly, a lower insulating layer 506-1 can include one or more insulating materials and/or layers. In one very particular embodiment, a lower insulating layer 506-1 can be etched to form an opening. Bottom electrode material (s) can be deposited within such an opening and then planarized to form bottom electrode 514.

Alternatively, a bottom electrode 514 can be a solid electrolyte.

FIG. 6B shows the formation of an upper insulating layer 506-0 over bottom electrode 514. An opening etch mask 624 can be formed on upper insulating layer. An upper insulating layer 506-0 can include one or more insulating materials and/or layers. In one very particular embodiment, a width (W) of an opening in opening etch mask 624 can be a minimum achievable lithographic dimension (e.g., a critical dimension, CD).

FIG. 6C shows an element 500A after an opening 504 is etched through upper insulating layer 506-0 and removal of opening etch mask 624. In addition, a sidewall layer 622 has been deposited or otherwise formed over upper insulating layer 506-0 and within opening 504. Such a sidewall layer 622 can include any of: insulating material(s), conductive and/or semiconductive material(s), or solid electrolyte material(s) depending upon element configuration.

FIG. 6D shows an element 500A after an anisotropic etching of sidewall layer 622 that results in the formation of sidewall structure 510 (e.g., spacer). It is noted that while FIG. 6D shows a clearing a bottom of opening 504 that exposes bottom electrode 514 (alternatively, a solid electrolyte), alternate embodiments can retain a thin layer of a sidewall material over bottom electrode 514 and/or include an etch stop layer over a top surface of bottom electrode 514.

FIG. 6E shows the formation of a solid electrolyte layer 618 within opening 504 and adjacent to sidewall structure 510. In the embodiment shown, solid electrolyte layer 618 is formed on a top surface of upper insulating layer 506-0. Solid electrolyte layer 618 can be formed with multiple layers, and include a concentration of one or more ion conducting elements as described herein, or equivalents.

Alternatively, layer 618 can be a top electrode material layer.

Figures 1, 6F:
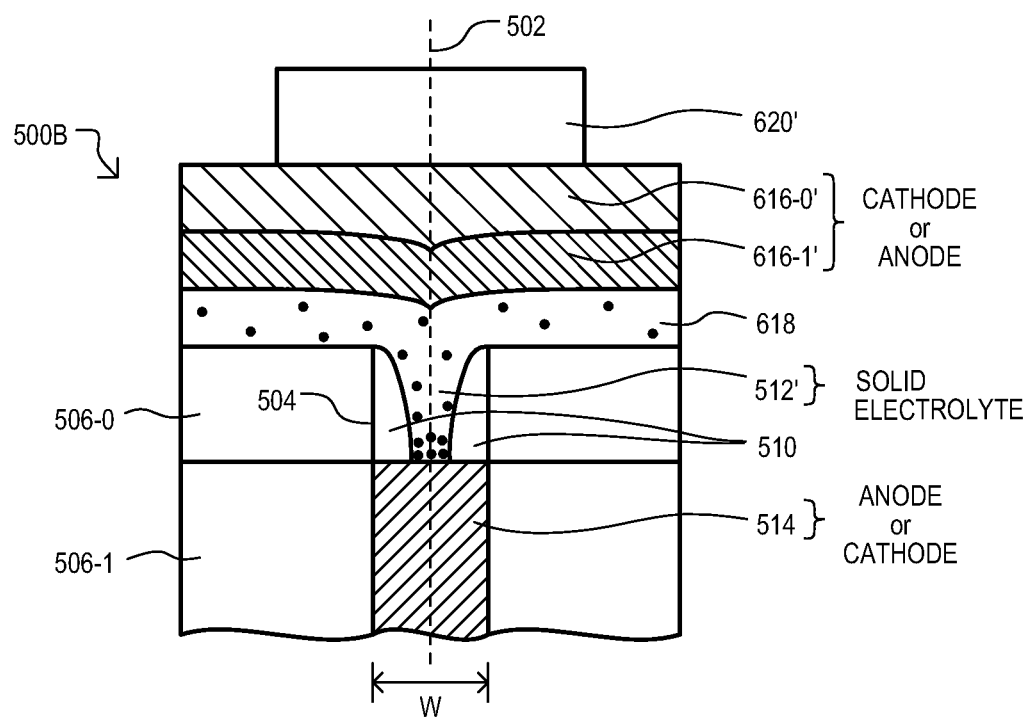
Figure 8A:
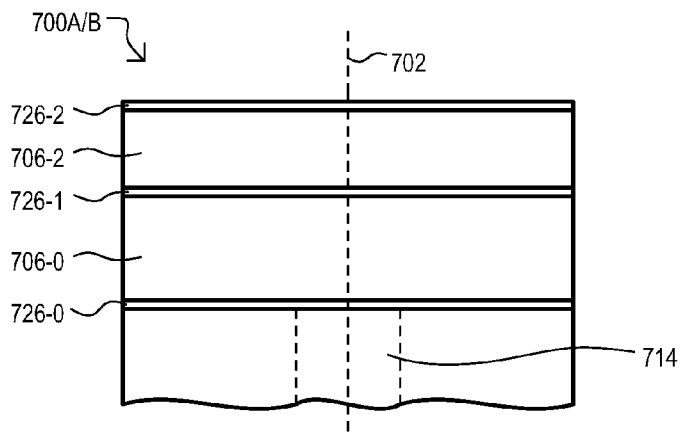
FIGS. 8A to 8J are a series of side cross sectional views showing a method of fabricating memory elements like those shown in FIGS. 7A and 7B.
Figure 8B:
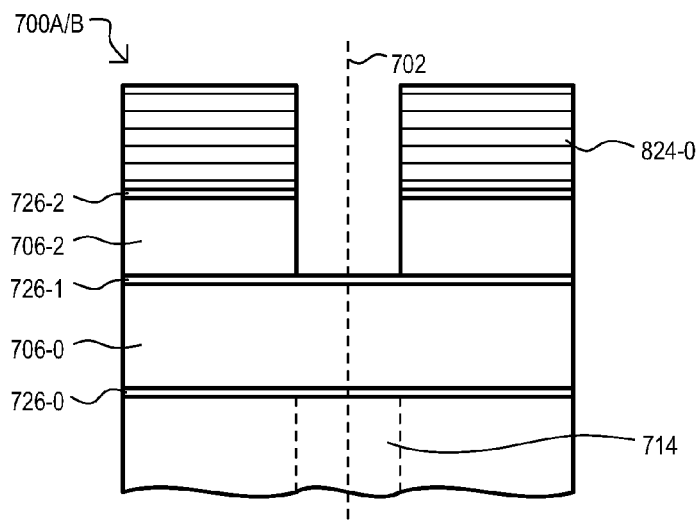
Figure 8C:
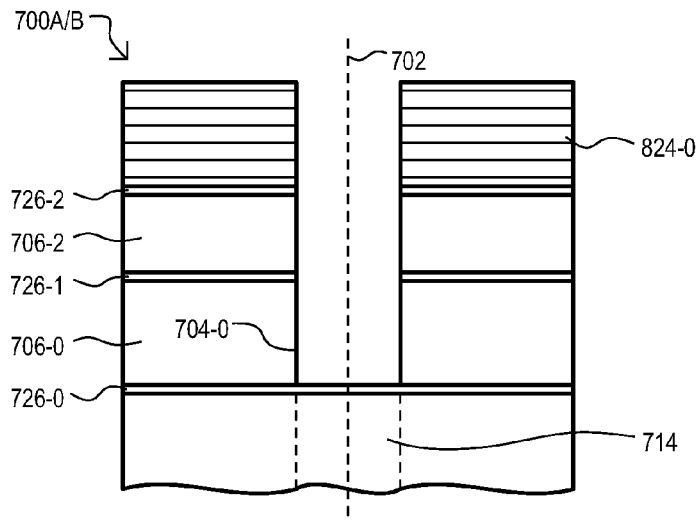
Figures 0, 8D:
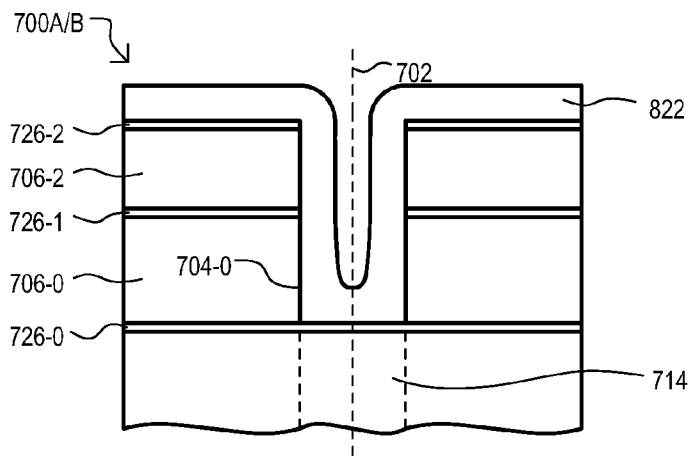

FIG. 6F-0 shows a planarization of solid electrolyte layer 618 to form tapered structure 512. Such a step can include any suitable planarization method including but not limited to chemical-mechanical polishing (CMP), and etchback step, or combinations thereof.

FIG. 6G shows the formation of upper electrode layers 616-0/1 on upper insulating layer 506-0, with electrode layer 616-1 being in contact with solid electrolyte tapered structure 512. An upper electrode etch mask 620 can then be formed over electrode layers 616-0/1. Exposed portions of upper electrode layers 616-0/1 can then be etched to arrive at a structure like that shown in FIG. 5A.

FIG. 6F-1 shows alternative steps that can follow FIG. 6G. FIG. 6F-1 shows the formation of upper electrode layers 616-0'/1' on solid electrolyte layer 618. An upper electrode etch mask 620' can then be formed over electrode layers 616-0'/1'. Exposed portions of upper electrode layers 616-0/1 and solid electrolyte layer 618 can then be etched to arrive at a structure like that shown in FIG. 5B.

Figure 7A:
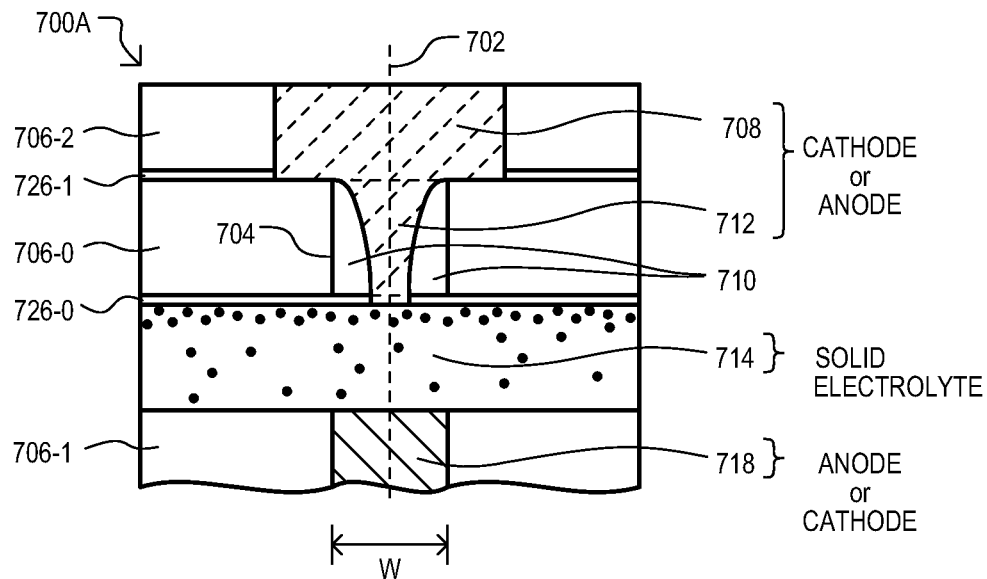
FIGS. 7A and 7B are side cross sectional views of memory elements having dual damascene structures according to embodiments.
Figure 7B:
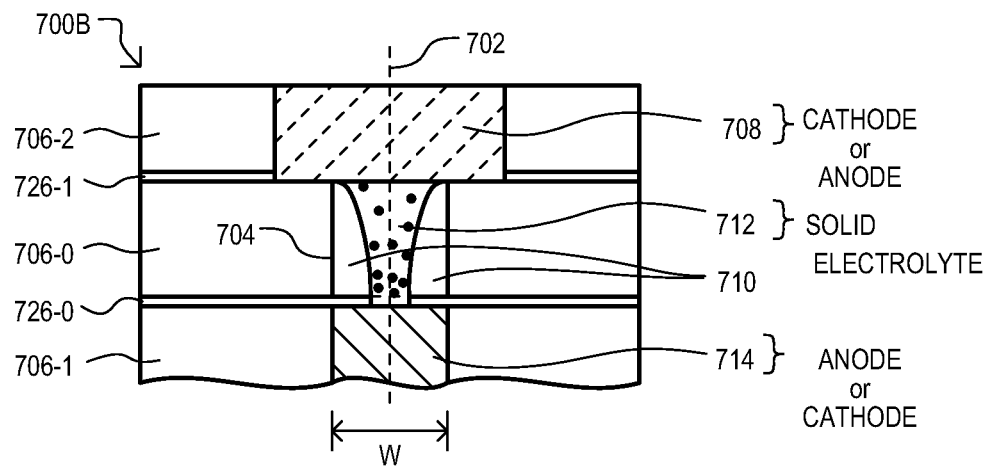

FIGS. 7A and 7B show CBRAM type memory elements 700A and 700B according to additional embodiments in side cross sectional views. FIGS. 7A and 7B show embodiments that can form tapered structures and top structures with "dual damascene" type methods. FIG. 7A shows an embodiment in which a top electrode is localized. FIG. 7B shows an embodiment in which a solid electrolyte is localized. Elements 700A/B can include sections like those of FIG. 1, and can be particular implementations of that shown in FIG. 1. Such a CBRAM type memory element can form a conductive filament as described herein.

In the particular embodiment of FIG. 7A, tapered structure 712 and top structure 708 can form a top electrode. Tapered portion 712 can be formed within a lower insulating layer 706-0 and top structure 708 can be formed within an upper insulating layer 706-2. A bottom structure 714 can include a solid electrolyte formed on a bottom electrode 718.

In some embodiments, a first liner 726-0 can be formed between bottom structure 714 and lower insulating layer 706-0. Optionally, a first liner 726-0 can extend between tapered structure 712 and bottom structure 714. In addition or alternatively, a second liner 726-1 can be formed between lower insulating layer 706-0 and upper insulating layer 706-2. Optionally, a second liner 726-1 can extend between top structure 708 and tapered structure 712.

In the particular embodiment of FIG. 7B, a top structure 708 can form a top electrode and a tapered portion 712 can include a solid electrolyte. A bottom structure 714 can form a bottom electrode. FIG. 7B can have liners 726-0/1 as shown in FIG. 7A.

In this way, a CBRAM type memory element with a localized solid electrolyte and/or electrode can be fabricated with dual damascene methods.

FIGS. 8A to 8J are a series of side cross sectional views showing a method of fabricating CBRAM type elements like those shown in FIGS. 7A and 7B.

FIG. 8A shows the formation of a first liner 726-0, first insulating layer 706-0, second liner 726-1, second insulating layer 706-2, and third liner 726-2 over a bottom structure 714. A bottom structure 714 can include a solid electrolyte (as in the case of FIG. 7A) or can include a bottom electrode (as in the case of FIG. 7B).

FIG. 8B shows the formation of a lower opening etch mask 824-0 on a top surface of third liner 726-2. An opening can be made through third liner 726-2, and a second insulating layer 706-2 can be etched to the second liner 726-1.

FIG. 8C shows the formation of a lower opening 704-0 by forming an opening through second liner 726-2 and etching through first insulating layer 706-0 to first liner 726-0.

Figures 0, 8E:
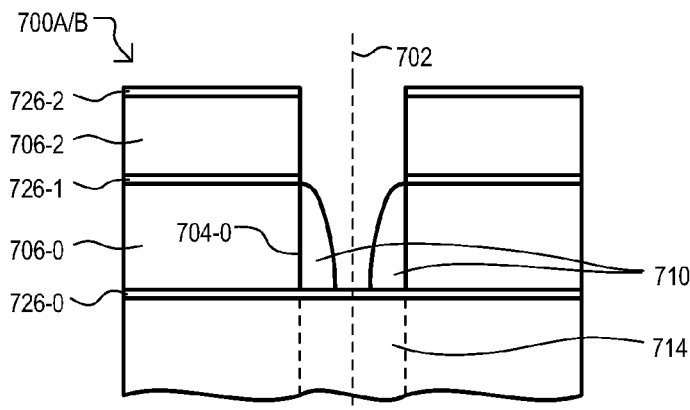
Figures 0, 8F:
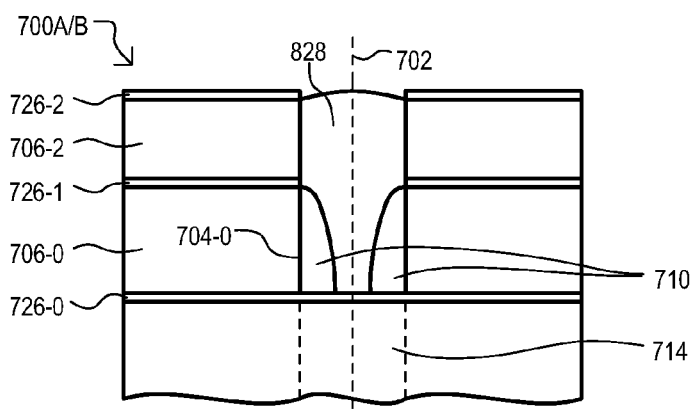
Figures 1, 8D:
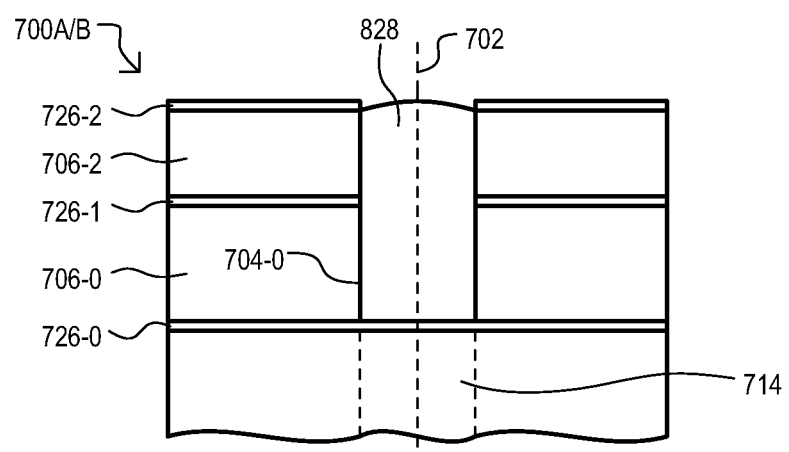
Figures 1, 8E:
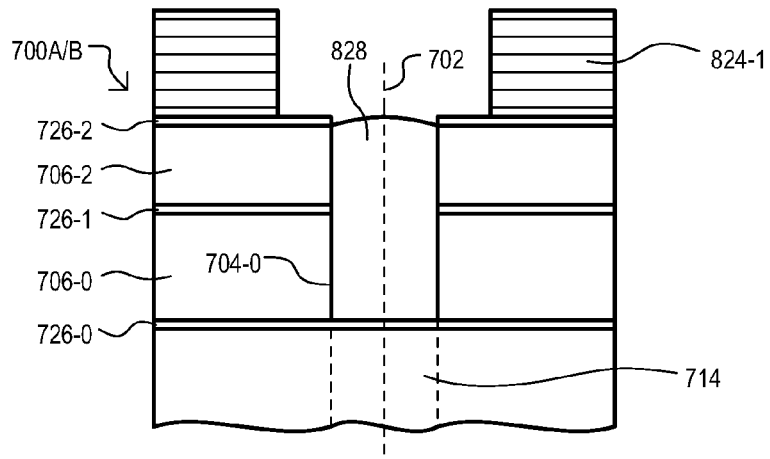
Figures 1, 8F:
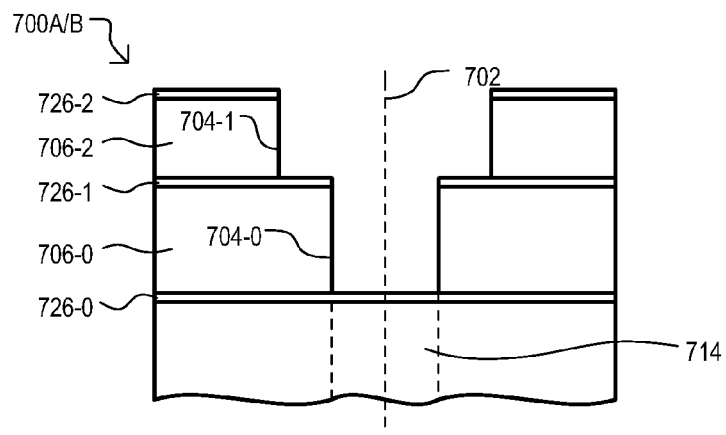
Figures 1, 8G:
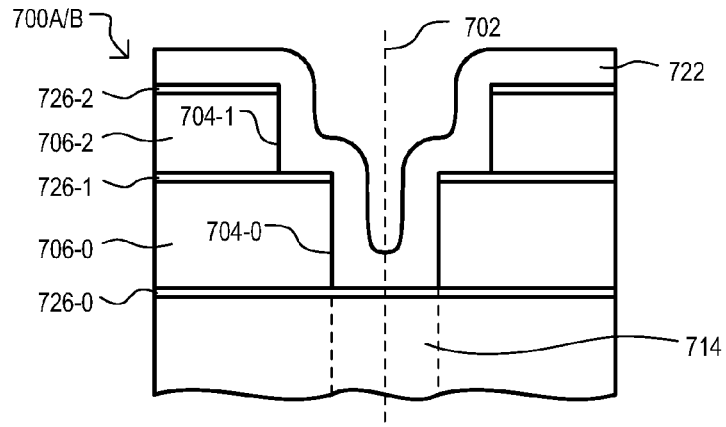
Figures 0, 8G:
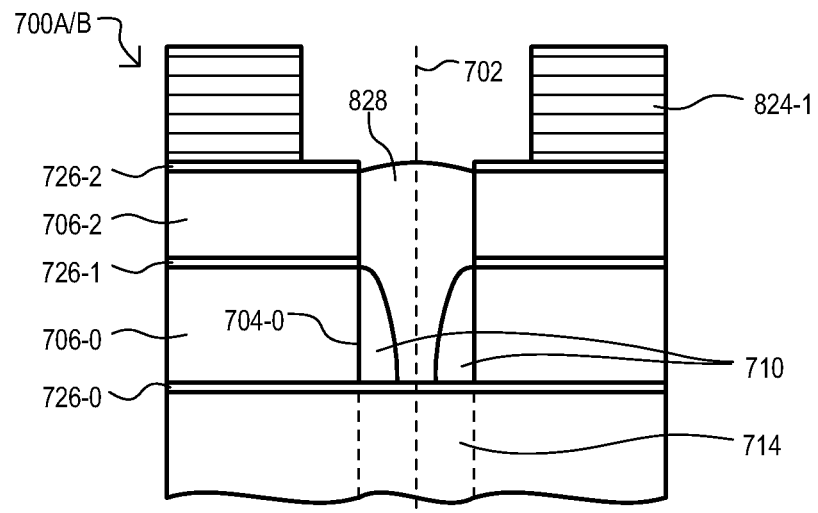

FIGS. 8D-0 to 8G-0 show steps following FIG. 8C according to one variant of the embodiments. Such steps show the formation of sidewall structures before the creation of a larger opening in the second insulating layer 706-2

FIG. 8D-0 shows the deposition of a sidewall layer 822 within lower opening 704-0.

FIG. 8E-0 shows the formation of sidewall structure 710 by anisotropically etching sidewall layer 822.

FIG. 8F-0 shows the formation of an etch fill material 828 within lower opening 704-0. Such an etch fill material can protect lower surfaces from subsequent processing steps, such as etching or the like.

FIG. 8G-0 shows the formation of an upper opening etch mask 824-1 on a third liner 726-2.

FIGS. 8D-1 to 8G-1 show other steps that can follow FIG. 8C according to another embodiment. Such steps show the formation of sidewall structures after the creation of a larger opening in the second insulating layer 706-2

FIG. 8D-1 shows the formation of an etch fill material 828 within lower opening 704-0. Such an etch fill material can protect lower surfaces from subsequent processing steps, such as etching or the like.

FIG. 8E-1 shows the formation of an upper opening etch mask 824-1 on a third liner 726-2.

FIG. 8F-1 shows the formation of an upper opening 704-1 through second insulating layer 706-2. Any remaining etch material 828 can be removed, exposing first liner 726-0.

FIG. 8G-1 shows the deposition of a sidewall layer 822 within upper opening 704-1 and lower opening 704-0.

Figure 8H:
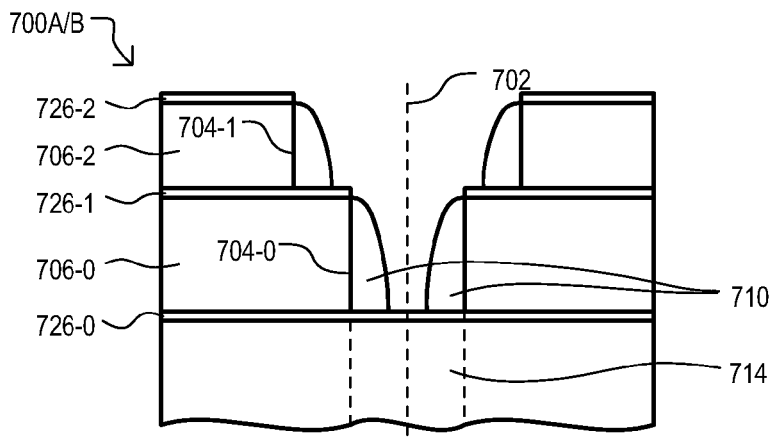
Figure 8I:
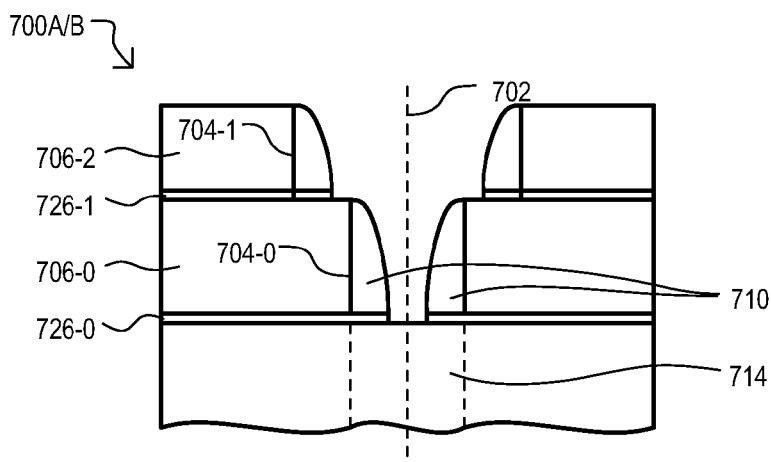

FIGS. 8H and 8I show steps that can follow FIG. 8G-0 or 8G-1.

Following FIG. 8G-0, FIG. 8H shows an element following the etching of an upper opening 704-1 and the removal of etch fill 828 and upper opening etch mask 824-1. Following FIG. 8G-1, FIG. 8H shows the anisotropic etching of sidewall layer 822 to create sidewall structures 710.

FIG. 8I shows an optional step that can remove portions of first liner 726-0 at a bottom of lower opening 704-0 to expose a bottom structure 714.

Figure 8J:
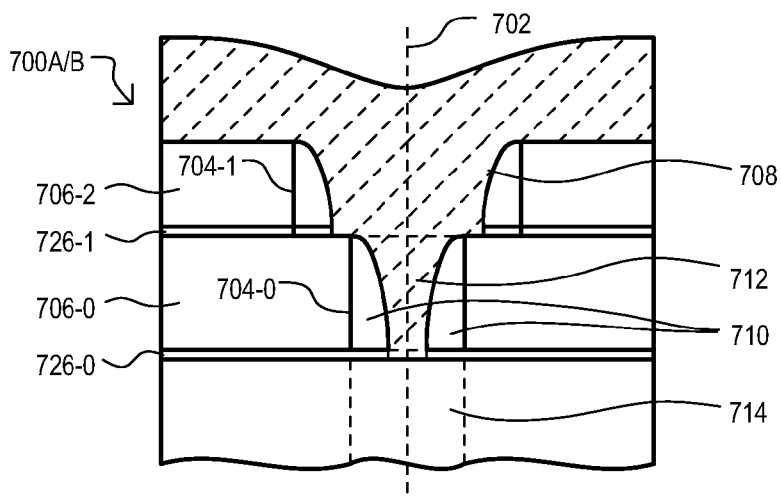

FIG. 8J shows the filling of lower opening 704-0 and upper opening 704-1 with one or more materials. Such materials can include conductive, semiconductive and/or solid state electrolyte materials, and combinations thereof.

Figure 9A:
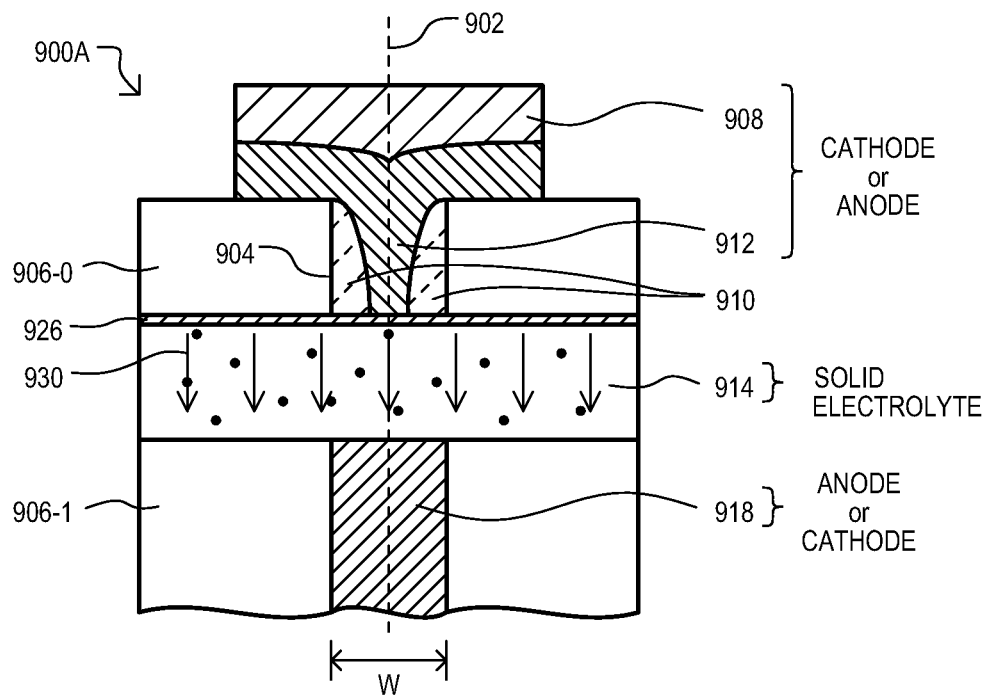
FIGS. 9A and 9B are side cross sectional views of memory elements having electric field shaping liners according to embodiments.
Figure 9B:
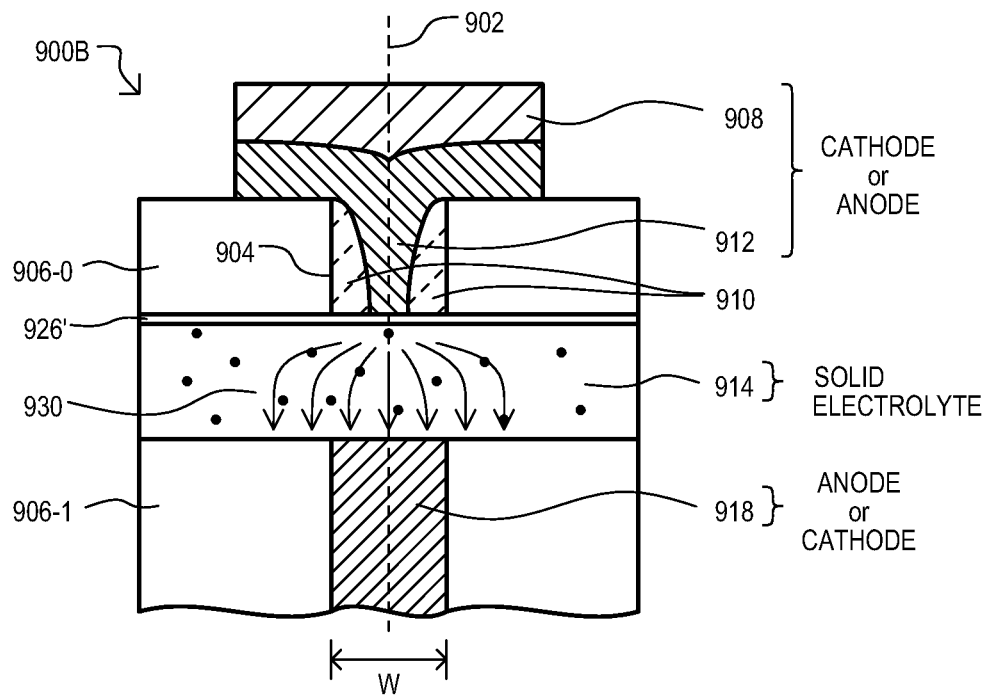

FIGS. 9A and 9B show CBRAM type memory elements 900A and 900B that can have liners selected for their effect on an electric field resulting from a bias being applied to an element. FIGS. 9A and 9B show memory elements (900A/B) having a structure like that shown in FIG. 5B, but with a liner 926/926' formed between an upper electrode (top structure 908/912) and a solid electrolyte (bottom structure 914). However, alternate embodiments can include liners, as described herein, in combination with other memory elements configurations described herein, or equivalents.

FIG. 9A shows an element 900A having a conductive liner 926. As shown by electric field lines (one shown as 930), a conductive liner 926 can be driven to substantially a same voltage as a top electrode (top structure 908/912), for a more uniform electric field across a solid electrolyte.

FIG. 9B shows an element 900A having an insulating liner 926'. As shown by electric field lines (one shown as 930), an insulating liner 926' can result in an electric field that is more concentrated at an electrode-solid electrolyte interface.

In this way, a CBRAM type memory element can include a liner layer between an electrode and a solid electrolyte layer.

Figure 10A:
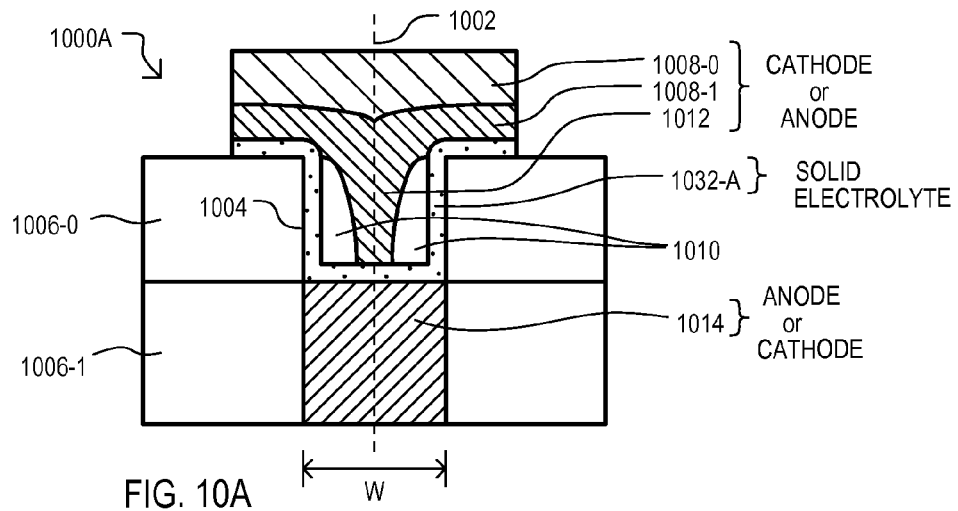
FIGS. 10A to 10C are side cross sectional views showing memory elements with non-planar solid electrolytes according to embodiments.
Figure 10B:
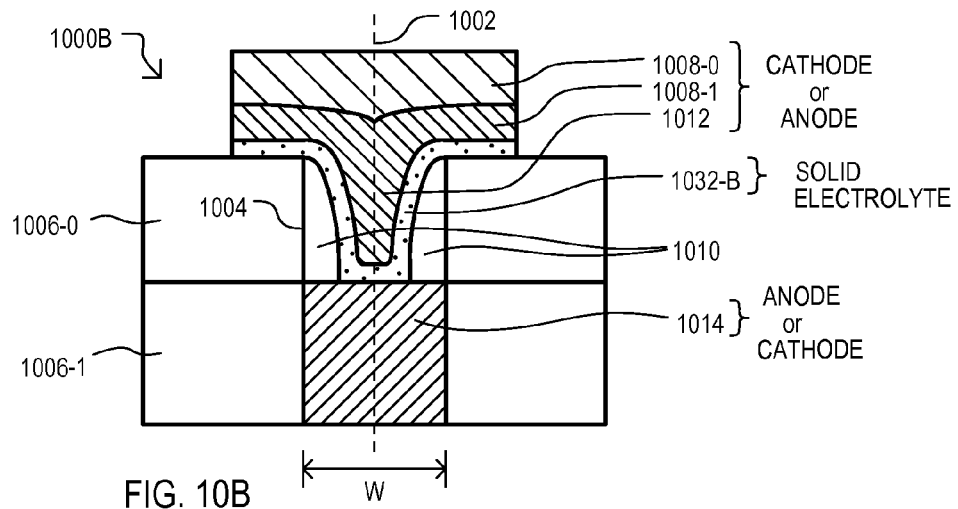
Figure 10C:
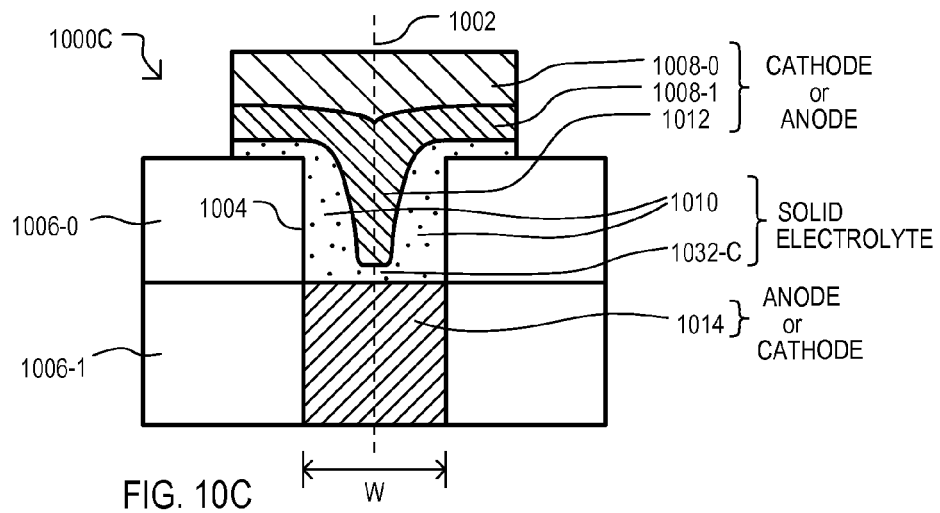

FIGS. 10A to 10C show CBRAM type memory elements 1000A/B/C according to additional embodiments in side cross sectional views. FIGS. 10A to 10C show embodiments that can include a non-planar solid electrolyte formed between a tapered first electrode and a second electrode. FIGS. 10A to 10C show memory elements (1000A/B/C) having a structure like that shown in FIG. 5B, but with a nonplanar solid electrolyte formed between a tapered portion of a first electrode and a second electrode.

FIG. 10A shows a memory element 1000A in which a nonplanar solid electrolyte 1032-A can be formed on sides and a bottom of opening 1004, including between spacer structure 1010 and opening 1004. In particular embodiments, this can include forming the solid electrolyte 1032-A before the steps shown in FIG. 6C, 8E-0 or 8H, as but a few examples. Spacer structure 1010 and solid electrolyte 1032-A can form a sidewall structure.

FIG. 10B shows a memory element 1000B in which a nonplanar solid electrolyte 1032-B can be formed on sides of a spacer structure 1010 and a bottom of opening 1004. In particular embodiments, this can include forming the solid electrolyte 1032-B after formation of spacer structure 1010 but with a material(s) that are thin with respect to a depth of opening 1004, and conformal to surfaces within the opening 1004. Spacer structure 1010 and solid electrolyte 1032-B can form a sidewall structure.

FIG. 10C shows a memory element 1000C in which a nonplanar solid electrolyte 1032-C can include a sidewall structure 1010 and be formed at a bottom of opening 1004. In particular embodiments, this can include depositing solid electrolyte layer(s) as a sidewall layer, and then anisotropically etching such layer(s) to arrive at the structure of FIG. 10C.

Figure 11A:
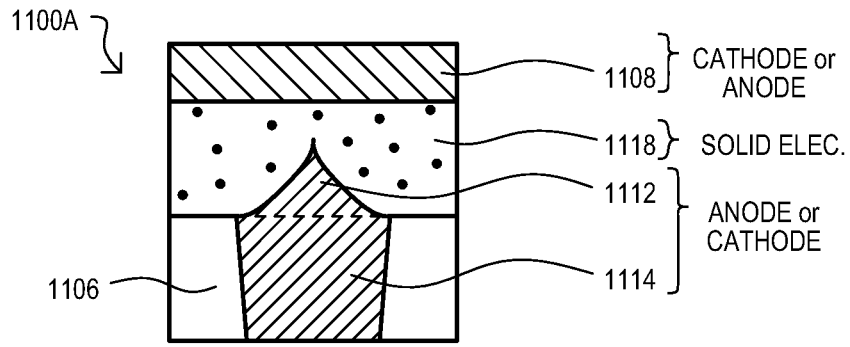
FIGS. 11A to 11C are side cross sectional views showing memory elements with tapered structures that narrow in an upward direction, according to embodiments.
Figure 11B:
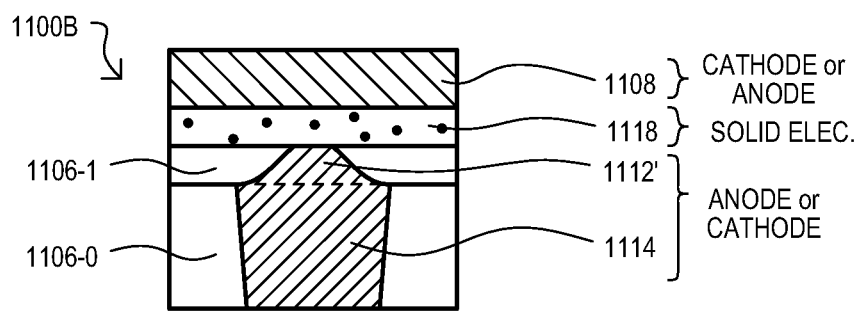
Figure 11C:
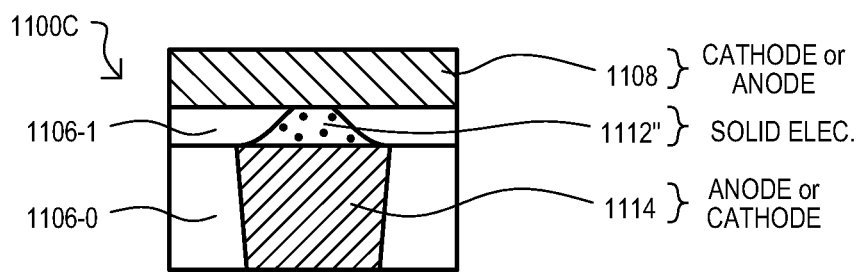

FIGS. 11A to 11C show CBRAM type memory elements 1100A/B/C according to further embodiments in side cross sectional views. FIGS. 11A to 11C show embodiments that can include a tapered structure that narrows in an upward direction, as opposed to a downward direction.

FIG. 11A shows a memory element 1100A in which a tapered structure 1112 and bottom structure 1114 can form a bottom electrode. A tapered structure 1112 can extend into a solid electrolyte 1118. A top structure 1108 can form a top electrode. In such an arrangement, a tapered structure 1112 can provide a highly localized electric field for writing and/or reading data from a memory element. Further, in the event a bottom electrode is an anode, a tapered structure 1112 can serve as a highly localized starting point (e.g., a seed) for the formation of a conductive filament. While tapered structure 1112 is shown to terminate in a point, in other embodiments, such structure can have a more blunt end, or a flat end.

FIG. 11B shows a memory element 1100B like that of FIG. 11A, however a tapered structure 1112' has a planarized top surface. Further, solid electrolyte 1118 can be formed on a second insulating layer 1106-1. A bottom structure 1114 can be formed in a first insulating layer 1106-0.

FIG. 11C shows a memory element 1100C in which a bottom structure 1114 can form a bottom electrode, a tapered structure 1112" can be formed from a solid electrolyte, and a top structure 1108 can form a top electrode. In such an arrangement, a solid electrolyte can be localized and thus have the appropriate advantages noted in other embodiments herein. In other embodiments, a tapered structure 1112" can include a portion of one or both of the electrodes.

In this way, a memory element can include a tapered structure that narrows in a direction toward a top surface of the electrode, where such tapered structure improves the localization of an electrode of a programmable memory element, a memory material of such element, or both.

FIGS. 12A to 12F-1 are a series of side cross sectional views showing a method of fabricating CBRAM type elements like those shown in FIGS. 11A to 11C.

Figure 12A:
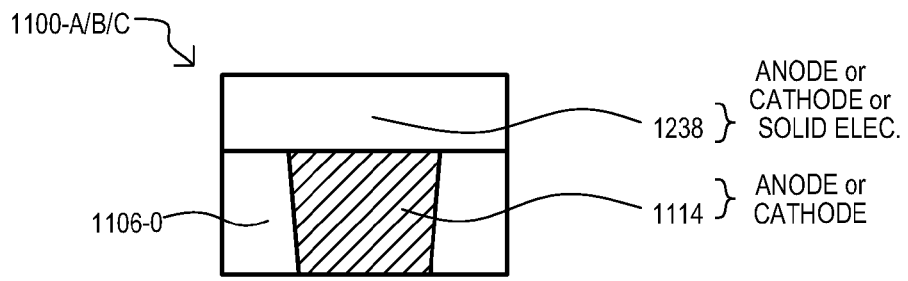

FIG. 12A shows the fabrication of a bottom electrode 1114 in a lower insulating layer 1106-0. A bottom electrode 1114 can be formed in the same fashion as bottom electrode 514 shown in FIG. 5A. A formation layer 1238 can be deposited on bottom structure 1114. A formation layer 1238 is formed from a material that is etchable to form a tapered structure. Accordingly, depending upon device variation, a formation layer 1238 can be formed from one more conductive, semiconductive and/or solid electrolyte materials.

Figure 12B:
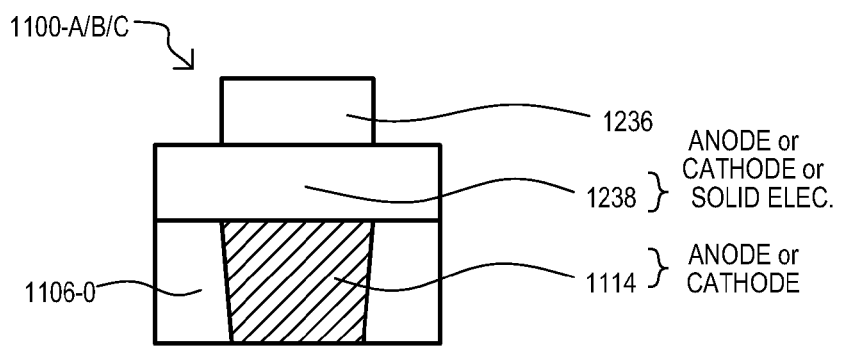

FIG. 12B shows the formation of a tapered structure etch mask 1236 over formation layer 1238.

Figure 12C:
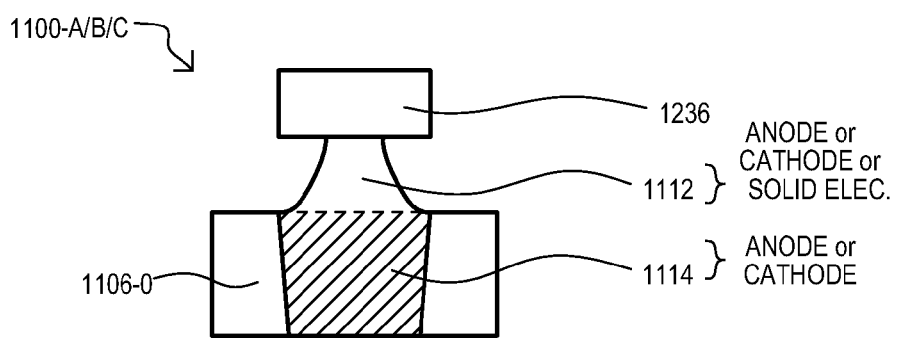

FIG. 12C shows a start of an isotropic etching of formation layer 1238. Such an etching can undercut formation layer 1238 under edges of tapered structure etch mask 1236. An etch mask 1236 could be removed at this point to provide a planarized surface for a tapered structure. Alternatively, as shown in FIG. 12F-1, planarization can be used to arrive at such a structure.

Figure 12D:
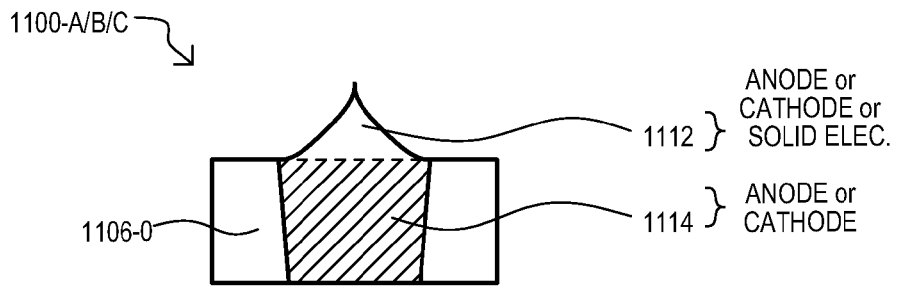

FIG. 12D shows the formation of tapered structure 1112. In some embodiments, such a step can include etching until a tapered structure etch mask 1236 lifts away, or alternatively, an etch mask 1236 can be removed.

Figures 0, 12E:
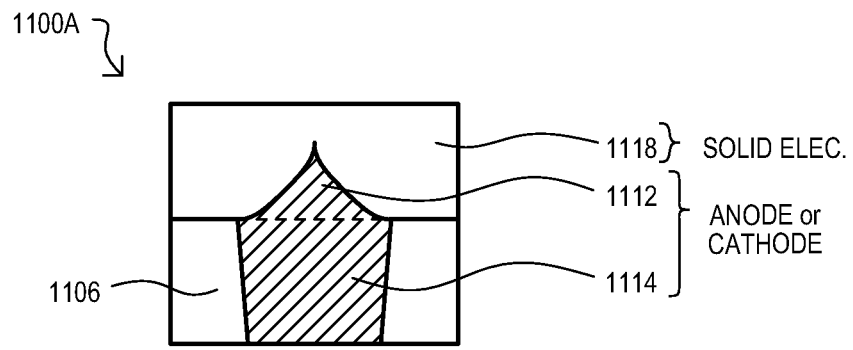
Figures 1, 12E:
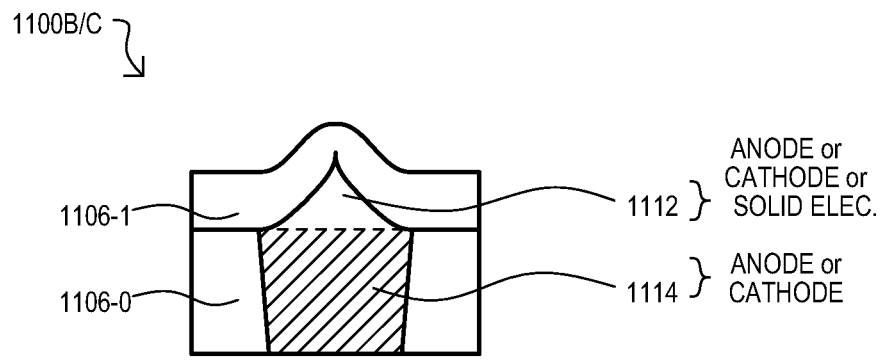

FIG. 12E-0 shows possible process steps that can follow those of FIG. 12D. A layer 1118 can be formed over a tapered structure 1112. Such a layer can be a solid electrolyte. An upper electrode can subsequently formed over layer 1118 to arrive at an element like that shown in FIG. 11A.

Figures 1, 12F:
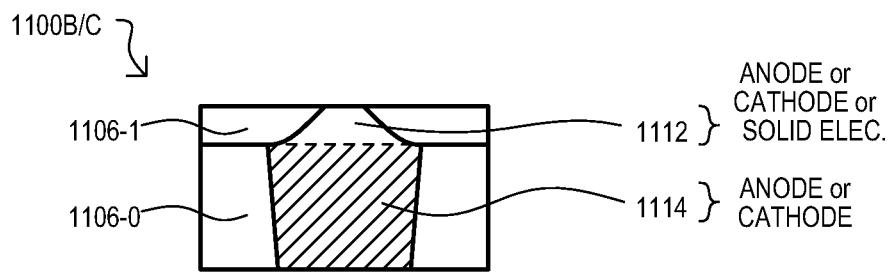

FIGS. 12E-1 and 12F-1 show alternate process steps that can follow those of FIG. 12D.

FIG. 12E-1 shows the formation of a second insulating layer 1106-1 over tapered structure 1112.

FIG. 12F-1 shows a planarization step that can planarize a top portion of tapered structure 1112. A solid electrolyte layer and upper electrode can subsequently formed over second insulating layer 1106-1 to arrive at an element like that shown in FIG. 11B. Alternatively, an upper electrode can subsequently formed over second insulating layer 1106-1 to arrive at an element like that shown in FIG. 11C.

Figure 13A:
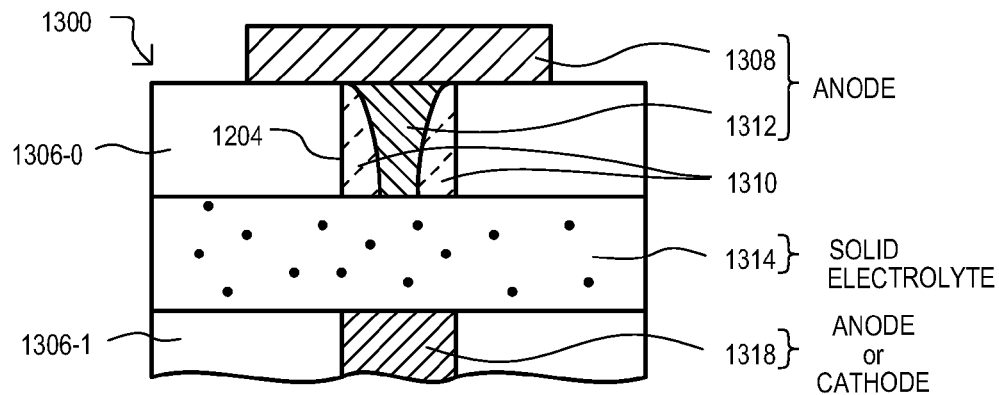
FIGS. 13A to 13C are a sequence of side cross sectional views of a memory element and method of operation, where a conductive structure can be formed in a void region.
Figure 13B:
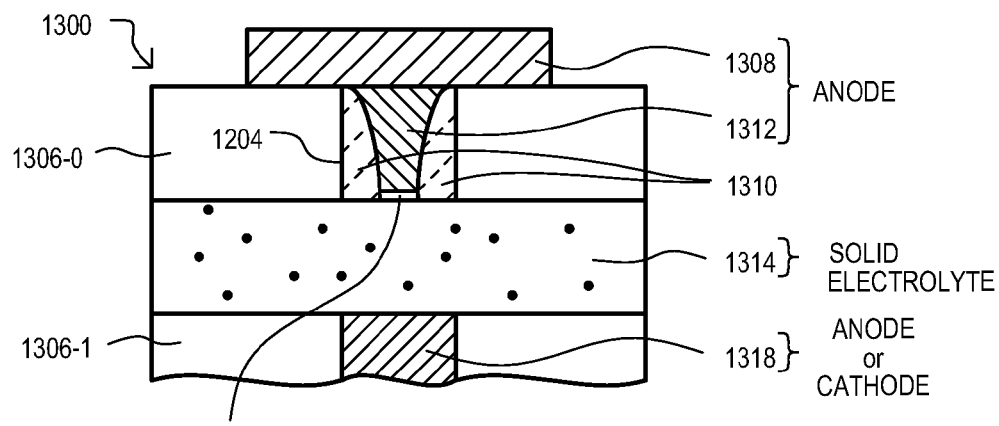
Figure 13C:
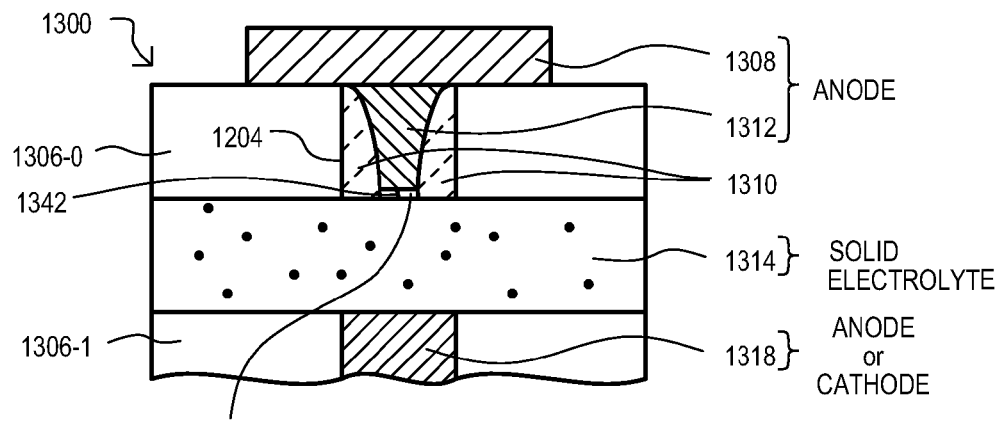

FIGS. 13A to 13C show a CBRAM type memory element 1300 according to another embodiment in side cross sectional views. FIGS. 13A to 13C show an embodiment that can include a "void" region through which a conductive filament can be formed and then dissolved to place the element in different data storage states.

The embodiment of FIG. 13A to 13C can have a structure like that of FIG. 5A. However, alternate embodiments that program via a filament through voids can take the form of other embodiments described herein, and equivalents, with a formation of a void between an active electrode and a solid electrolyte.

FIG. 13A shows a memory element 1300 prior to being conditioned. A tapered structure 1312, which forms all or part of an anode electrode, can have a direct contact with solid electrolyte 1314.

FIG. 13B shows a memory element 1300 after being conditioned. By application of a conditioning bias voltage, a void 1340 can be formed between solid electrolyte 1314 and tapered structure 1312. That is, by application of the bias voltage, portions of tapered structure 1312 can oxidize and ion conduct into solid electrolyte in sufficient numbers to create a void 1340.

FIG. 13C shows a memory element 1300 after being programmed. By application of a first program voltage, a conductive filament 1342 can be created through void 1340 to solid electrolyte 1314. A second program voltage of opposite polarity can dissolve such a filament.

In this way, a memory element can include an anode having a tapered structure, and a void between an anode and a solid electrolyte, across which a conductive filament can be created or dissolved to program the element.

Figure 14:
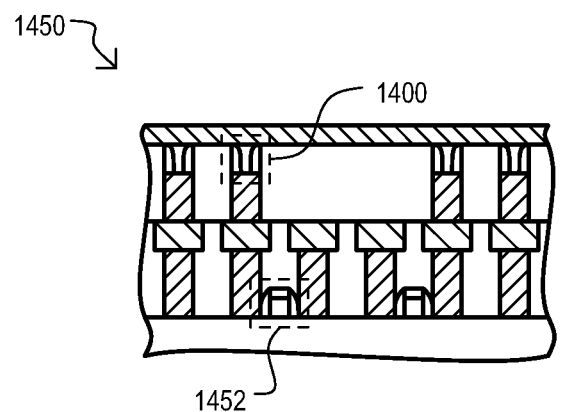
FIG. 14 is a side cross sectional view of a memory device according to an embodiment.

FIG. 14 shows a cross section of a memory device 1450 according to an embodiment. A memory device 1450 can include memory elements as described herein and equivalents. A memory device 1450 can include front-end of line (FEOL) items, such as active devices (one shown as 1452). Memory elements (one shown as 1400) can be formed after front-end process steps, and be back-end of line (BEOL) structures.

A memory device 1450 can include memory cells formed by one or more memory elements (e.g., 1400) alone, or one or more such memory elements in combination with one or more active devices. Active devices can include any suitable transistor.

Figure 15:
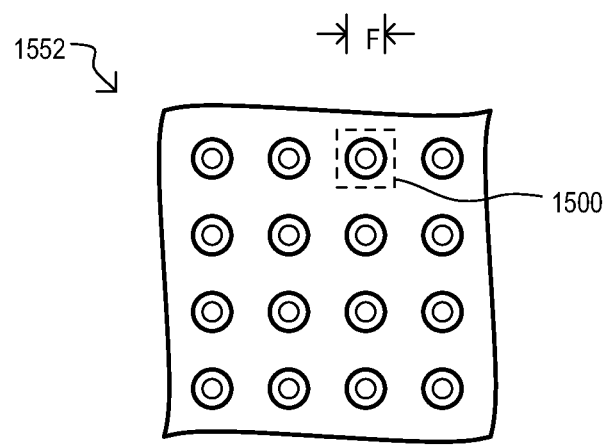
FIG. 15 is a top cross sectional view of a memory device according to an embodiment.

FIG. 15 shows a top cross sectional view of a memory element array 1450 according to an embodiment. A memory element array 1552 can include memory elements (one shown as 1500) as described herein and equivalents arranged into an array.

In the particular embodiment shown, each element can be formed in a critical dimension (F) (e.g., a minimum achievable lithographic dimension), for a highly compact array size.

As noted above, embodiments can form various memory elements types, but in particular embodiments can include CBRAM type elements. It is understood that while conventional CBRAM elements can include elements programmed between different resistance states, CBRAM type elements as used herein is intended to encompass elements that exhibit varying dynamic changes in property (e.g., resistance, capacitance) under sense conditions. Further, a CBRAM type element does not necessarily included in a random access memory (RAM) architecture, and can be included in EEPROM and any other architecture, including custom architectures.

In embodiments above, CBRAM type elements can include a solid electrolyte, as well as electrodes, either of which can be a cathode electrode or an anode electrode.

An anode electrode can include one or more elements than can ion conduct with a solid electrolyte. An anode electrode can thus include metals and/or compounds of metals and non-metals. Such non-metals can include any material providing a suitable conductivity, including semiconductor materials and/or other materials, such as chalcogens. Particular anode electrode materials for embodiments can include, but are not limited to: single metals, such as Ag, Cu; metal alloys, such as a RuAg alloy, CuAg alloy or combination, and/or a chalcogenide such as $Ag_2S$.

In some embodiments, a cathode electrode includes an electrochemically inert portion in contact with a solid electrolyte. A cathode electrode can include metals and/or compounds of metals and non-metals and/or semiconductor materials. Particular anode electrode materials for embodiments can include, but are not limited to: W, Ti, TiN, Ta, TaN, Al, Pt, Ir, Ru, and/or $IrO_2$.

A solid electrolyte can include any suitable solid electrolyte that provides an electrochemical response producing a desired change in element property. In particular embodiments, a solid electrolyte can include a chalcogenide compound, metal oxide, or combinations thereof. In some embodiments, one or more ion conducting elements can be included in the solid electrolyte.

A solid electrolyte can also be multilayered and/or include non-contiguous portions of different materials. Such different materials can be added to vary a memory element performance. Such performance variations can include but are not limited to: thermal stability, increased resistance, decreased resistance, faster filament formation, slower filament formation, reduced ion conductivity, increased ion conductivity. Particular solid electrolyte materials for embodiments can include, but are not limited to: chalcogenides of Te, Se or S, and compounds of GeSx, GeSex, AsS, AsSe, AsTe, GeTe; or any suitable metal oxide, such transition metal oxides, including rare earth element oxides. Other metals can be added including magnesium, aluminum, or transition metals selected to have different ion conducting rates, or to substantially not ion conduct at all.

As noted above, an anode electrode and/or solid electrolyte can include one or more ion conducting elements. In particular embodiments, an ion conducting element can be a metal that oxidizes in the application of an electric field. Particular ion conducting elements for embodiments can include, but are not limited to: Cu, Ag, and/or Zn.

Embodiments above have described liners. Liner materials can be selected according to desired etch stop characteristics and/or conductivity or insulating properties. Particular liner materials for embodiments can include, but are not limited to: silicon oxide, silicon nitride, and/or TiN.

Embodiments shown above can have a number of advantages, particularly where such embodiments are CBRAM type memory elements. Examples of such embodiments are noted below.

Reduction of memory element size below achievable lithographic limits can lead to greater memory density as compared to conventional approaches. Further, such scaling to smaller element size can be done independent of front end fabrication limits (i.e., active area size). Even further, memory element sizing can be standardized between technology generations (e.g., process nodes), providing for easier transitions between such generations.

Localization of a conductive "filament" (or filament forming structures) can provide for more consistent device operation. Minimizing the area of such a filament can provide tighter Ron distributions (Ron=resistance of element in low resistance state). This is in contrast to larger area (e.g., non-localized) structures that can generate multiple filaments in a same element, or include variations arising from differences in surface.

Localization of element features can reduce leakage current of an element in a high resistance state as an element presents a smaller cross section area for such current. This can provide greater Ron/Roff ratio, as compared to conventional approaches. This same reduction in element cross section can also reduce operating power, as current flow occurs through a smaller area.

Localization of element structures can provide a smaller anode-solid electrolyte interface. A larger size interface, which can exist in conventional approaches, can be more prone to agglomeration of mobile ion material, due to thermal cycles in a manufacturing process. Such agglomeration can create greater variation in element response, and could even lead to shorts. Embodiments can reduce such interface sizes as compared to conventional approaches.

Higher doping at an anode-electrolyte interface can lead to greater data retention, as such a structure can reduce ion conduction away from the interface, as compared to conventional approaches presenting substantially uniform doping of a solid electrolyte.

Metal spacers in conjunction with metal fill material can include work functions that can localize filament (or conductive region) formation.

While embodiments have shown memory elements with tapered structures that extend in a downward direction or upward direction, other embodiments can include both.

It should be appreciated that reference throughout this description to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics can be combined as suitable in one or more embodiments of the invention.

It is also understood that other embodiments of this invention can be practiced in the absence of an element/step not specifically disclosed herein.

Similarly, it should be appreciated that in the foregoing description of exemplary embodiments of the invention, various features of the invention are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claims require more features than are expressly recited in each claim. Rather, inventive aspects lie in less than all features of a single foregoing disclosed embodiment. Thus, the claims following the detailed description are hereby expressly incorporated into this detailed description, with each claim standing on its own as a separate embodiment of this invention.

The invention claimed is:

1. A programmable memory element, having at least one localized element structure, comprising:
   at least an anode electrode, solid electrolyte, and cathode electrode aligned with one another along a substantially vertical axis; wherein
   at least one of the electrodes includes a tapered structure having a wide portion that tapers to a narrow portion in the vertical axis direction, and
   the anode electrode is formed from at least one element oxidizable to ion conduct in the solid electrolyte; wherein the tapered structure forms at least part of the anode electrode and is formed within an opening having a sidewall structure formed thereon,
   the solid electrolyte is formed below the opening, and
   the cathode electrode is formed below the solid electrolyte.

2. The programmable memory element of claim 1, wherein:
   the tapered structure is formed within an opening having a sidewall structure formed thereon, the sidewall structure comprises a different material than the tapered structure.

3. The programmable memory element of claim 1, wherein:
   the solid electrolyte is selected from: a chalcogenide and a metal oxide.

4. The programmable memory element of claim 1, further including:
   the tapered structure comprises at least a portion of the anode electrode and is separated from the solid electrolyte by a void region; wherein
   a conductive path through the void region is formed and dissolved by application of electric fields.

\* \* \* \* \*